US009362923B2

(12) United States Patent
Mizogami et al.

(10) Patent No.: US 9,362,923 B2
(45) Date of Patent: Jun. 7, 2016

(54) DELAY CIRCUIT

(71) Applicant: Kabushiki Kaisha Toshiba, Minato-ku, Tokyo (JP)

(72) Inventors: Takayuki Mizogami, Tokyo (JP); Masayuki Koizumi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/644,143

(22) Filed: Mar. 10, 2015

(65) Prior Publication Data
US 2016/0020774 A1   Jan. 21, 2016

(30) Foreign Application Priority Data

Jul. 18, 2014  (JP) .................... 2014-148174

(51) Int. Cl.
*H03L 7/06* (2006.01)
*H03L 7/081* (2006.01)

(52) U.S. Cl.
CPC .................... *H03L 7/0812* (2013.01)

(58) Field of Classification Search
USPC .................... 327/147–149, 156–158
See application file for complete search history.

(56) References Cited

U.S. PATENT DOCUMENTS

| 6,031,788 | A * | 2/2000 | Bando | G11C 7/1072 |
| | | | | 365/230.08 |
| 6,768,690 | B2 * | 7/2004 | Kwon | G11C 7/22 |
| | | | | 365/189.12 |
| 6,911,853 | B2 * | 6/2005 | Kizer | G06F 1/10 |
| | | | | 327/158 |
| 6,960,948 | B2 * | 11/2005 | Kizer | G06F 1/10 |
| | | | | 327/147 |
| 6,995,591 | B2 * | 2/2006 | Lee | H03K 5/131 |
| | | | | 327/149 |
| 7,135,903 | B2 * | 11/2006 | Kizer | G06F 1/10 |
| | | | | 327/159 |
| 7,312,668 | B2 * | 12/2007 | Li | H03K 3/0315 |
| | | | | 327/156 |
| 7,786,775 | B2 * | 8/2010 | Otsuka | H03H 11/26 |
| | | | | 327/149 |
| 8,471,736 | B1 * | 6/2013 | Booth | G04F 10/005 |
| | | | | 327/105 |
| 8,994,575 | B2 * | 3/2015 | Hagihara | G04F 10/005 |
| | | | | 341/155 |
| 9,098,072 | B1 * | 8/2015 | Waltari | H03M 1/0656 |
| 9,197,197 | B2 * | 11/2015 | Asquini | H03K 5/1252 |
| 2006/0197566 | A1 * | 9/2006 | Jakobs | H03K 5/131 |
| | | | | 327/158 |
| 2007/0115035 | A1 * | 5/2007 | Hinz | H03K 5/135 |
| | | | | 327/156 |
| 2009/0309638 | A1 * | 12/2009 | Delage | H03K 3/0322 |
| | | | | 327/158 |
| 2010/0085094 | A1 * | 4/2010 | Ma | G06F 1/06 |
| | | | | 327/158 |
| 2011/0169537 | A1 * | 7/2011 | Ma | G06F 1/06 |
| | | | | 327/158 |
| 2012/0007642 | A1 * | 1/2012 | Miyahara | H03L 7/0996 |
| | | | | 327/156 |
| 2012/0182053 | A1 * | 7/2012 | Yang | H03L 7/16 |
| | | | | 327/119 |

FOREIGN PATENT DOCUMENTS

JP   11-185470 A   7/1999

* cited by examiner

*Primary Examiner* — Adam Houston
(74) *Attorney, Agent, or Firm* — White & Case LLP

(57) ABSTRACT

A delay circuit includes units each of which includes a first delay element having a first input node and a first output node, a second delay element having a second input node and a second output node, and a third delay element between the first and second delay elements. The first output node of a first unit of the units is connected to the first input node of a second unit of the units. The second input node of the first unit is connected to the second output node of the second unit. A signal on the first input node of the first delay element of the first unit is output from the second output node of the second delay element of the first unit through the third delay element of the second unit.

20 Claims, 8 Drawing Sheets

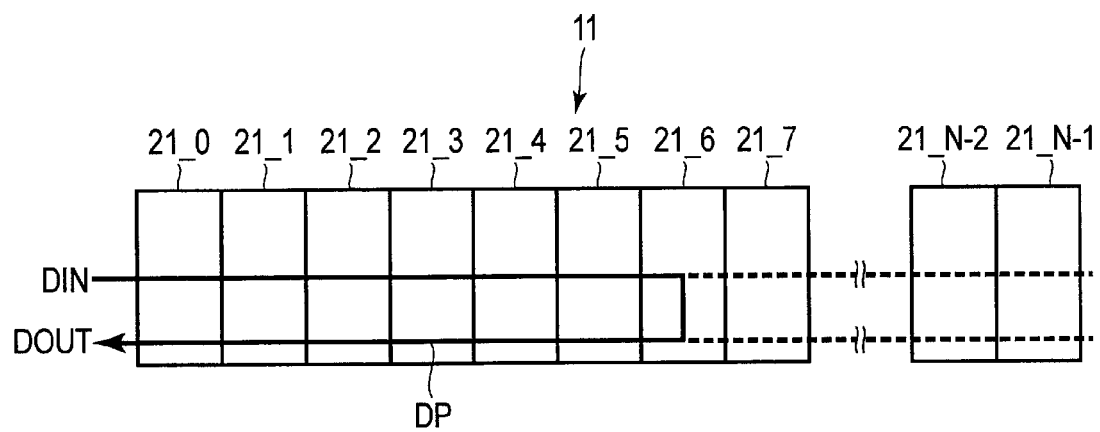
F I G. 6
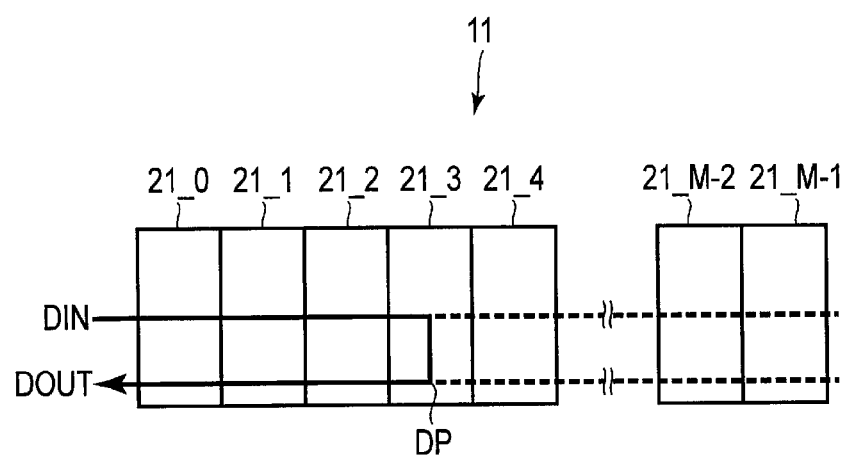
F I G. 7

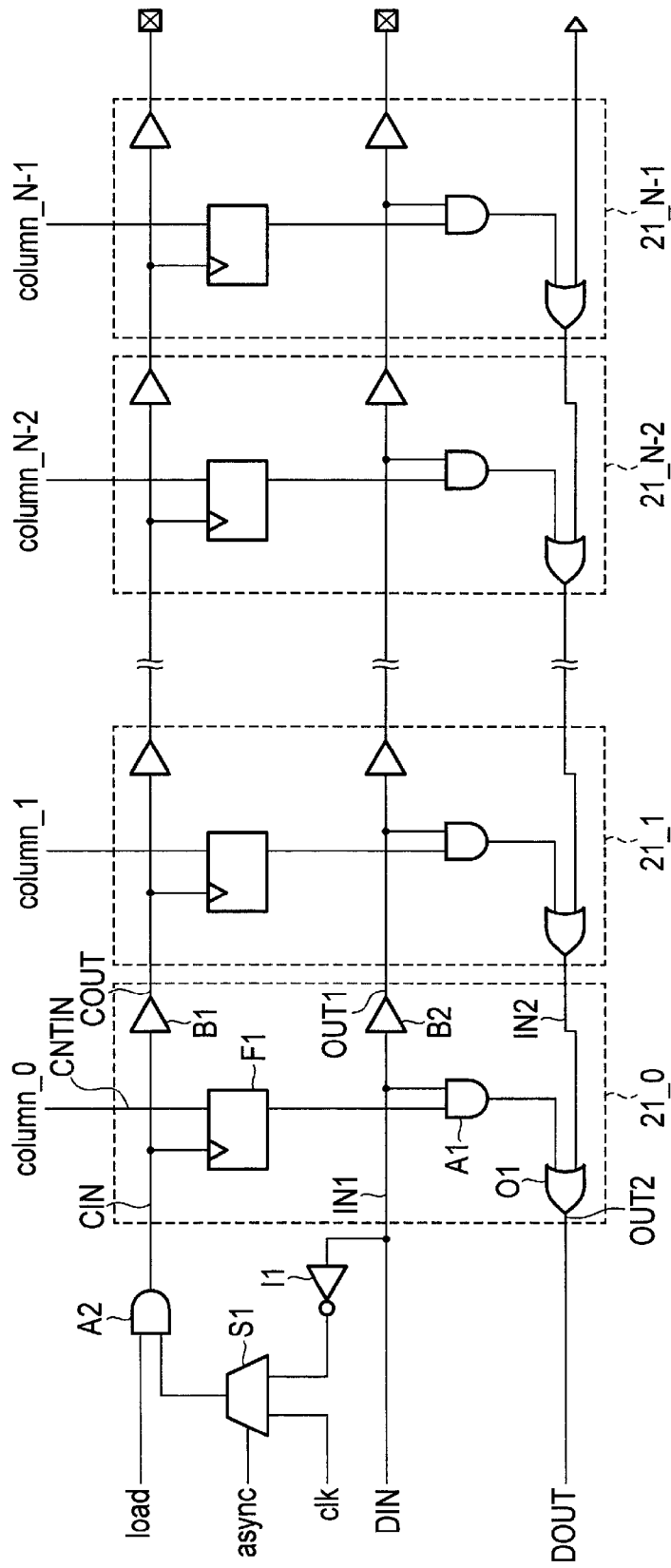
F I G. 8

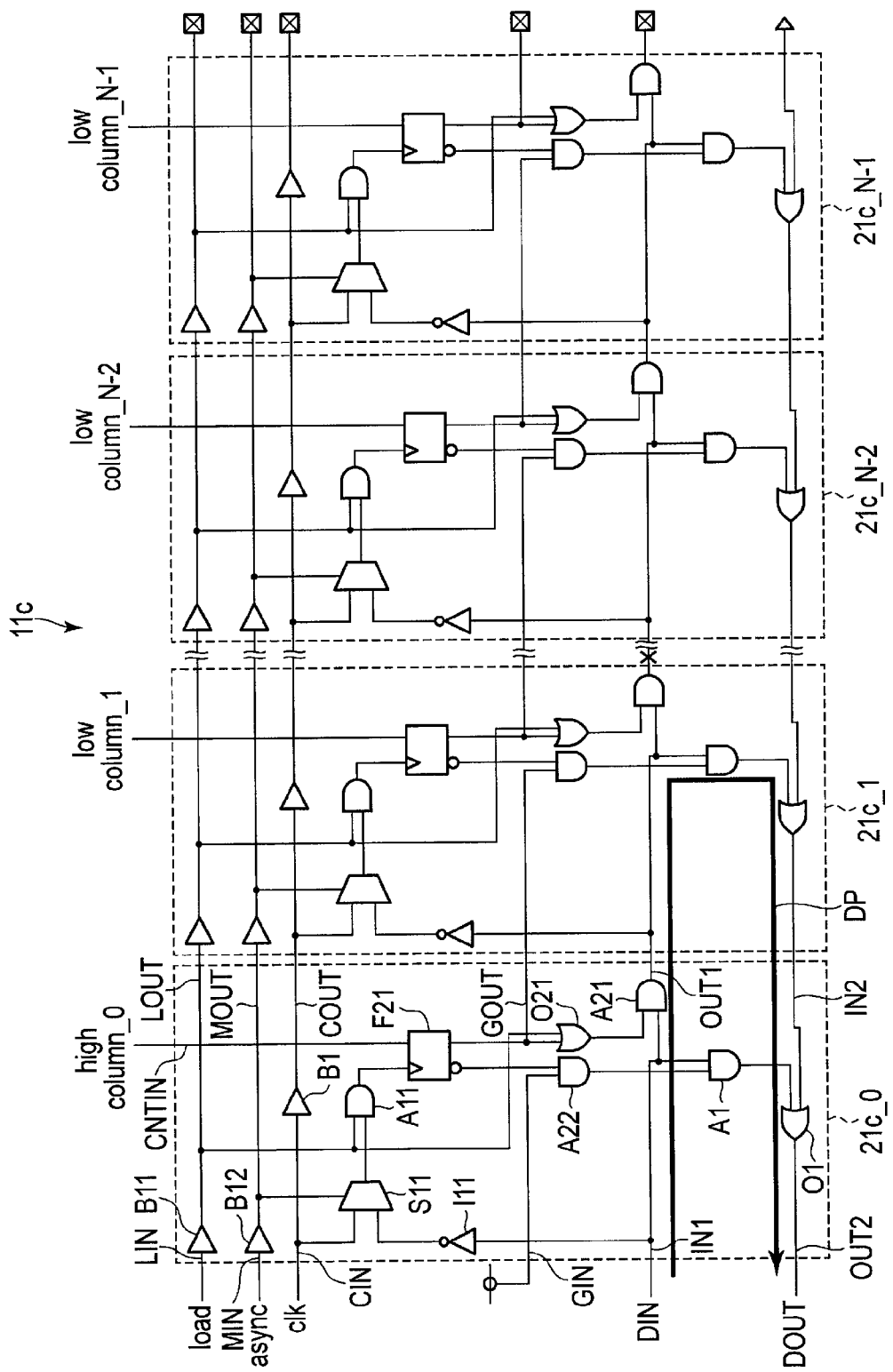
F I G. 10

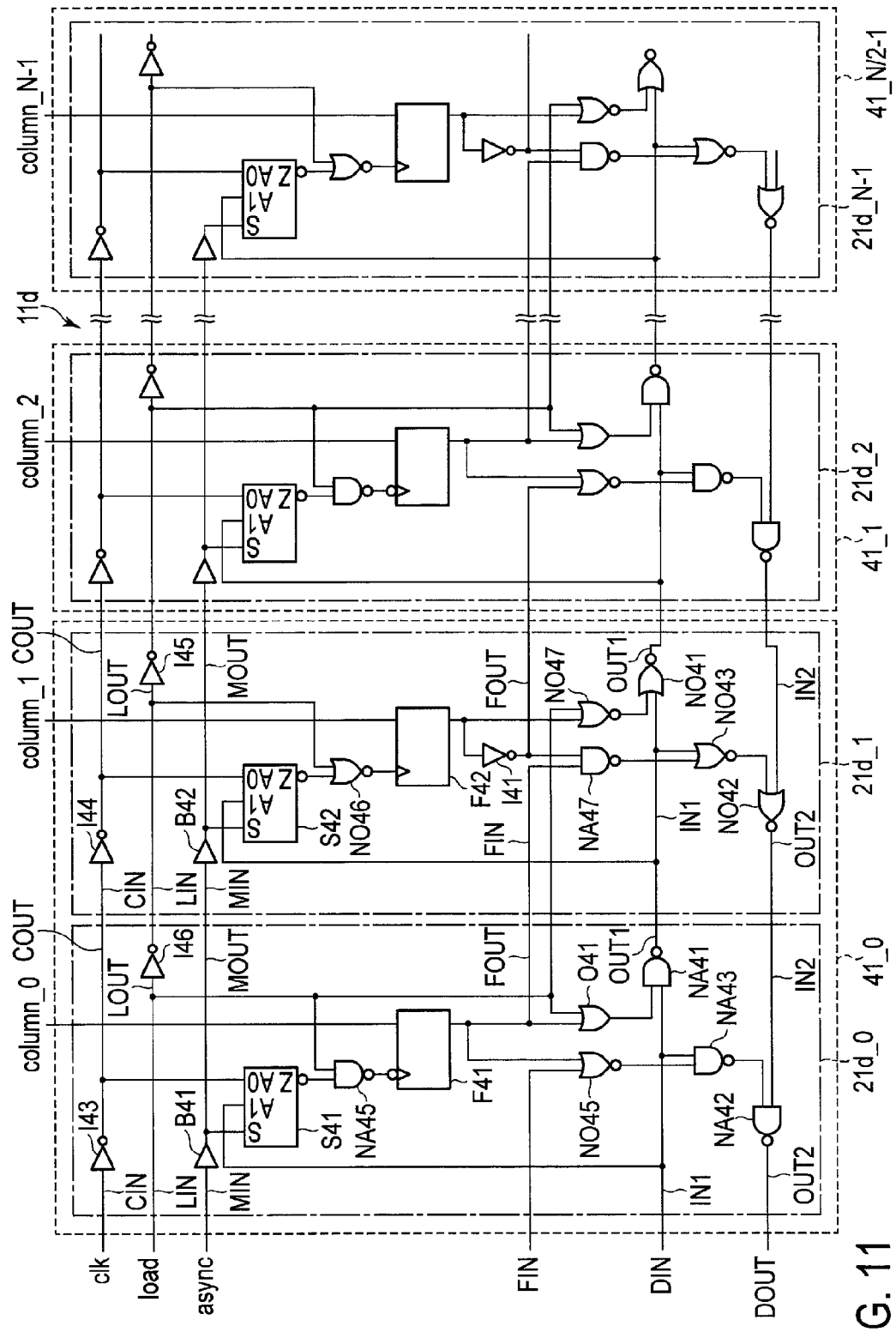
F I G. 11

DELAY CIRCUIT

CROSS-REFERENCE TO RELATED APPLICATIONS

This application is based upon and claims the benefit of priority from Japanese Patent Application No. 2014-148174, filed Jul. 18, 2014, the entire contents of which are incorporated herein by reference.

FIELD

Embodiments relates to a delay circuit.

BACKGROUND

Semiconductor devices receive a clock from, for example, outside, and operate in accordance with the received clock. The clock may be made to be delayed due to various reasons. In order to execute such a delay, a delay circuit is used.

BRIEF DESCRIPTION OF THE DRAWINGS

FIG. 6 illustrates a selected state of the delay section of the first embodiment;
FIG. 7 illustrates another example of the delay section of the first embodiment;
FIG. 8 illustrates an example of a specific circuit of the delay section of the first embodiment;
FIG. 10 illustrates an example of a specific circuit of a delay section of a third embodiment;
and
FIG. 11 illustrates an example of a specific circuit of a delay section of a fourth embodiment.

DETAILED DESCRIPTION

A delay circuit of an embodiment includes units each of which includes a first delay element which has a first input node and a first output node, a second delay element which has a second input node and a second output node, and a third delay element between the first delay element and the second delay element. The first output node of the first delay element of a first unit of the units is connected to the first input node of the first delay element of a second unit of the units. The second input node of the second delay element of the first unit is connected to the second output node of the second delay element of the second unit. A signal on the first input node of the first delay element of the first unit is output from the second output node of the second delay element of the first unit through the third delay element of the second unit.

Delay circuits delay an input signal. Some of the delay circuits are configured to implement a variable amount of a delay. Such delay circuits include a delay circuit used for adjusting the phase of a clock. The delay circuit with a capability of varying the amount of delay includes a delay section and a controller, for example. The delay section receives a signal to be delayed and delays the received signal. The controller controls the delay in the delay section using, for example, a delay locked loop (DLL).

The delay circuit for delaying a clock is required to implement at most a delay of 360°, i.e. a delay of one cycle. This is because a clock has a periodic wave. Using such a delay circuit with the maximum 360°-delay capability can implement any amount of delay within 360° with the resolution of the delay circuit. Some delay circuits may, however, not need the 360° delay due to various factors, such as usage and/or environment. For example, a delay circuit used in a particular position in a semiconductor device may only need to have a capability of 180° delay at maximum. Using the delay circuit with the 360°-delay capability in such a usage results in inefficiency. The reasons for such include the large footprint and high electric power consumption associated with a delay circuit having the 360°-delay capability. In order to deal with such an issue, a delay circuit may have plural delay sections. The delay sections differ from each other in the maximum amount of delay. Specifically, a particular delay section can implement 360° delay at maximum, and another delay section can implement 180° delay at maximum.

Figure 1:
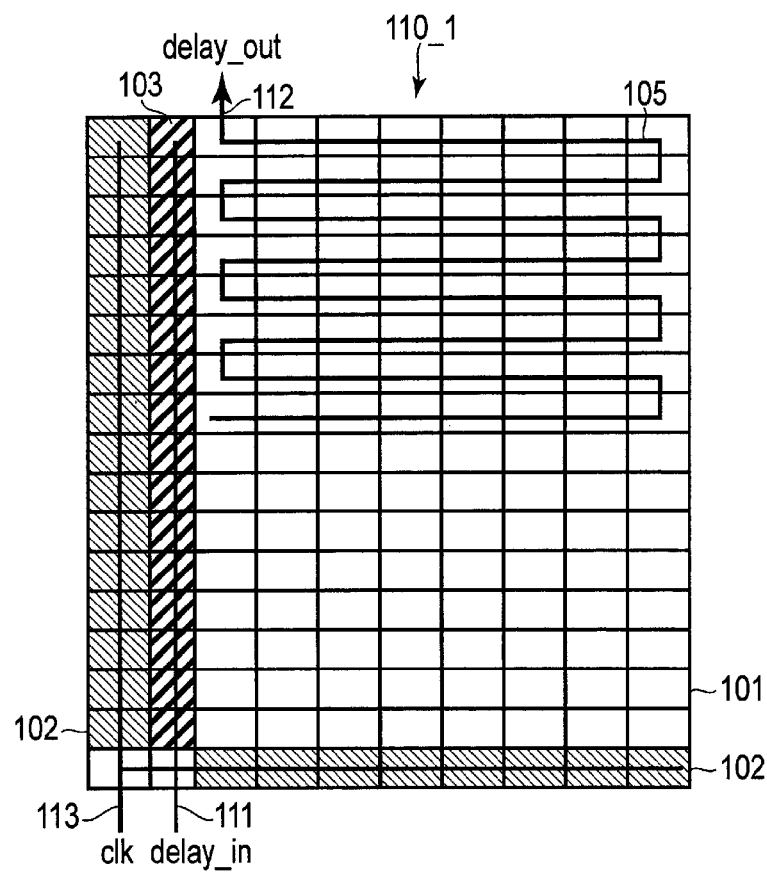
FIG. 1 illustrates a first example of a delay section for reference.
Figure 2:
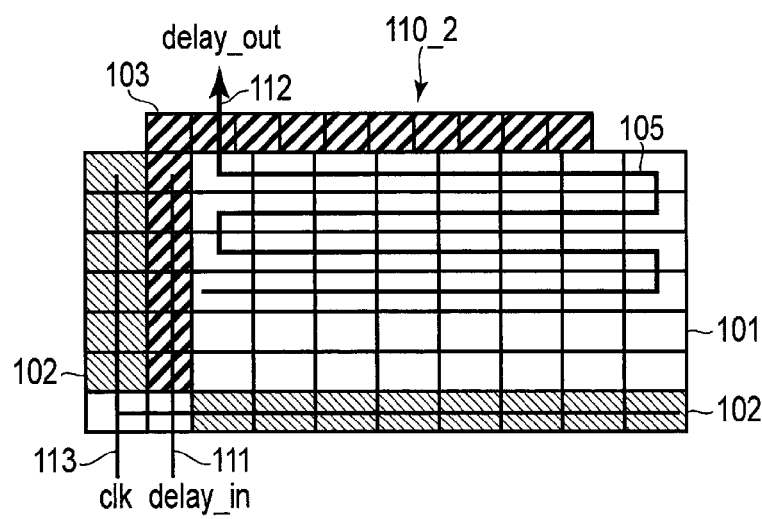
FIG. 2 illustrates a second example of a delay section for reference.
Figure 3:
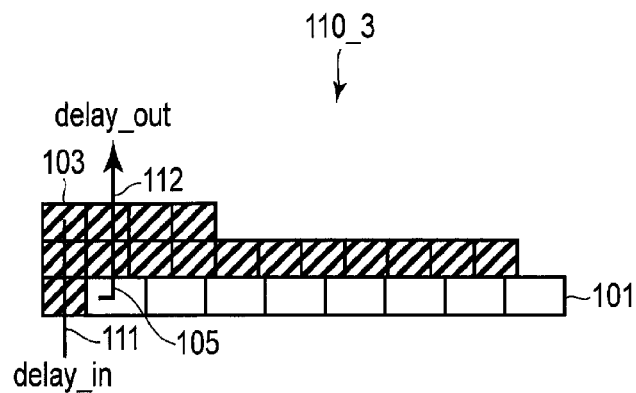
FIG. 3 illustrates a third example of a delay section for reference.

In theory, realization of such delay sections with different maximum delay amounts can be done by providing different numbers of delay elements in separate delay sections. It, however, is insufficient in actuality, and the delay sections with different maximum delay amounts need to have uniform properties other than maximum delay amounts. In order to implement the delay sections which can fulfill such a request, delay sections illustrated in FIGS. 1 to 3 can be considered. FIGS. 1 to 3 schematically illustrate layouts of delay sections 110_1 to 110_3 with different maximum delay capabilities (i.e., configurations). FIGS. 1 and 3 illustrate delay sections 110_1 and 110_3 which have the maximum and minimum delay capabilities, respectively. FIG. 2 illustrates a delay section 110_2 which has the delay capability of half the maximum delay amount, i.e., 180°.

Each delay section 110 receives a signal DIN which will be delayed on an input node 111, and outputs a delayed signal DOUT on an output node 112. Components 101 are delay units, include elements to delay the input signal, are arranged in a matrix, and are all connected in series. Components 102 are registers, store a signal (or, a code) input from outside in order to implement a specified delay, and receive a clock clk on a node 113. The clock clk is used for operation of the delay sections 110, and differs from the to-be-delayed clock. Components 103 are AND gates. With only suitable registers 102 storing an asserted code, a delay path through specified ones of all delay units 101 is formed between the input node 111 and the output node 112. Specifically, in FIG. 1, a delay unit 101 in the eighth row from the top and the first column from the left is connected to the input node 111, and a delay path through delay units 101 in the first to eighth rows from the top is formed between the input node 111 and the output node 112. Among all delay units 101, those in the delay path formed between the input node 111 and the output node 112 make a delay path 105.

The delay section of the maximum configuration of FIG. 1 has a rectangular shape, includes chains of registers 102 along the bottom and left edges, and includes a chain of AND gates 103 between the chain of registers 102 on the left edge and the matrix of the delay units 101. The input node 111 is connected to the inputs of all the AND gates. Moreover, a clock input node 113 is connected to the input nodes of all the registers 102.

The delay sections of FIGS. 2 and 3 have the configuration of the delay section 110_1 of the maximum configuration with some part removed and modified. Specifically, the delay sections of FIGS. 2 and 3 include fewer delay units 101 than that of FIG. 1, and therefore are smaller than that of FIG. 1 in the dimension along the top-and-bottom direction. This leads to a smaller distance between the input node 111 and the output node 112 than that of FIG. 1. Moreover, in order for the delay sections 110 with different configurations to have similar properties, the input nodes 111 are desired to have common properties over different configurations. To this end, the delay sections 110_2 and 110_3 of FIGS. 2 and 3 are provided with redundant AND gates 103 to have as many AND gates as those in the delay section 110_1 of FIG. 1 in order for the input nodes 111 to have substantially the same interconnect resistance and load capacity. Thus, the delay section of the maximum configuration is designed first, and delay sections of a smaller configuration are designed with the same properties as the delay section of the maximum configuration maintained.

The delay section of the maximum configuration has many delay units, and therefore is connected at the input node 111 to many AND gates 103, and the clock input 113 is also connected to many registers 102. For this reason, the nodes 111 and 112 have significantly heavy loads, and therefore take a long time to be charged and cannot operate at high speed. In addition, the input node 111 connected to many logical gates restricts high-speed operation of the delay section 110_1 of the maximum configuration due to another reason. Specifically, a change in the combination of the asserted codes for adjusting the delay amount needs to be executed while the input node 111 is low. The charging and discharging of the input node 111, however, require a long time, which reduces a necessary margin for the timing in changing the combination of codes.

Furthermore, the delay sections of non-maximum configuration are implemented by the change from the delay section of the maximum configuration, and therefore the performance of the delay sections of non-maximum configurations may be restricted by that of the delay section of the maximum configuration. Specifically, the input node 111 of the delay section 110_1 of the maximum configuration is connected to a large number of AND gates 103 as described above. For this reason, the input node 111 has a very heavy load, which prevents high-speed operation. Furthermore, the input nodes 111 of the delay section 110_2 and 110_3 of non-maximum configurations are also connected to a large number of AND gates 103, which are necessary to maintain uniformity of properties but unnecessary for operation itself, and therefore hinder improvements in operation speed and power consumption and unnecessarily increase the areas of the delay sections 110. Moreover, the change in configuration forces the position of the output node 112 to be changed. This changed configuration results in a difference in operation timing from that in the maximum configuration, and this difference necessitates adjustment.

Embodiments will now be described with reference to the figures. In the following description, components with substantially the same functionalities and configurations will be referred to with the same reference numerals, and repeated descriptions may be omitted. Moreover, all descriptions for a particular embodiment are also applicable to other embodiments, unless explicitly or obviously stated otherwise.

Each functional block does not need to be distinguished as in the following examples. For example, some of the functions may be implemented by functional blocks different from those illustrated below. Furthermore, an illustrated functional block may be divided into functional sub-blocks. The embodiments are not limited by the specification of the particular functional blocks.

First Embodiment

Figure 4:
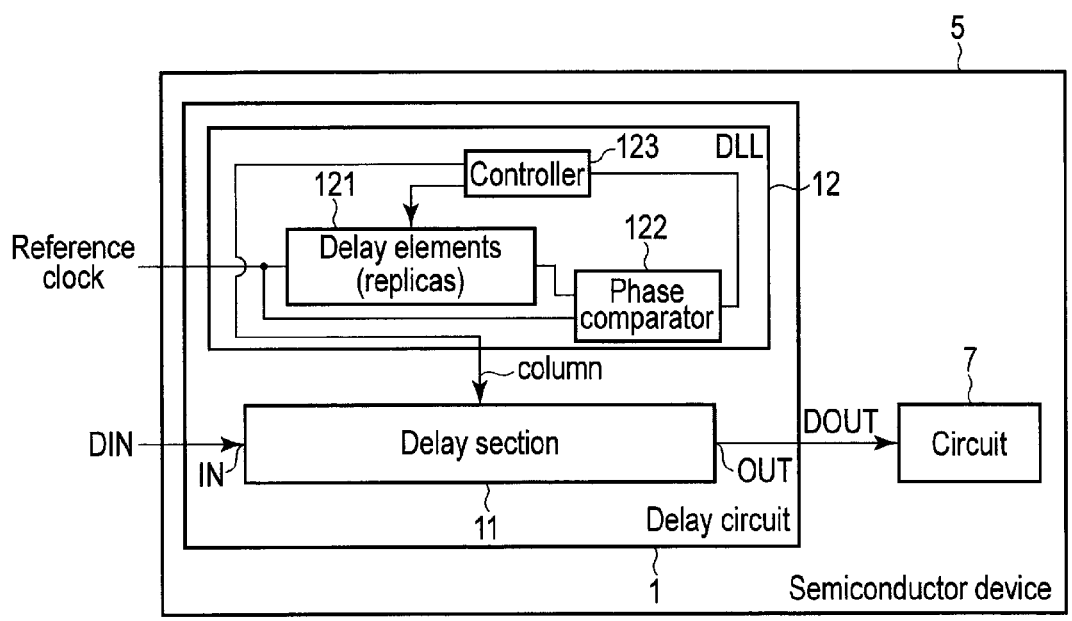
FIG. 4 illustrates a delay circuit of a first embodiment.

FIG. 4 illustrates a delay circuit of the first embodiment. A delay circuit 1 receives an input signal DIN, and outputs an output signal DOUT corresponding to the input signal DIN after a lapse of a particular time. The delay circuit 1 has a delay section 11 and a DLL 12. The delay section 11 includes components for delaying the input signal DIN, receives the input signal DIN, and outputs the output signal DOUT. The DLL 12 can be considered to be outside the delay circuit 1.

The DLL 12 controls the amount of a delay by the delay section 11. The DLL 12 includes a chain of delay elements 121 with the capability of delay of 360° at maximum. These delay elements 121 are replicas of delay elements in the delay section 11, for example. The DLL 12 receives a reference clock on the input of the delay element chain 121, and the reference clock travels through the delay element chain 121 to be delayed. The DLL 12 compares the phase of the output of the delay element chain 121 with the reference clock using a phase comparator 122. The phase comparator 122 supplies the results of the comparison to a controller 123. The controller 123 increases or decreases the number of enabled delay elements in the delay element chains 121 to adjust the amount of the delay of the delay element chain 121 to 360°. Furthermore, the DLL 12 generates signals for controlling the amount of the delay by the delay section 11 using the controller 123 in accordance with feedback. Specifically, the controller 123 uses the feedback which implements 360° delay to generate the control signal columns which implement a delay of 90° or 180° by the delay section 11. The control signal columns correspond to column select signal "column", which will be described later.

The delay circuit 1 is included in, for example, a semiconductor device 5. The semiconductor device 5 receives a signal such as a clock. The clock is received by the delay circuit 1 as the input signal DIN. The delay circuit 1 delays the clock to output a delayed clock as the output signal DOUT. The delayed clock is received by the circuit 7, for example.

Figure 5:
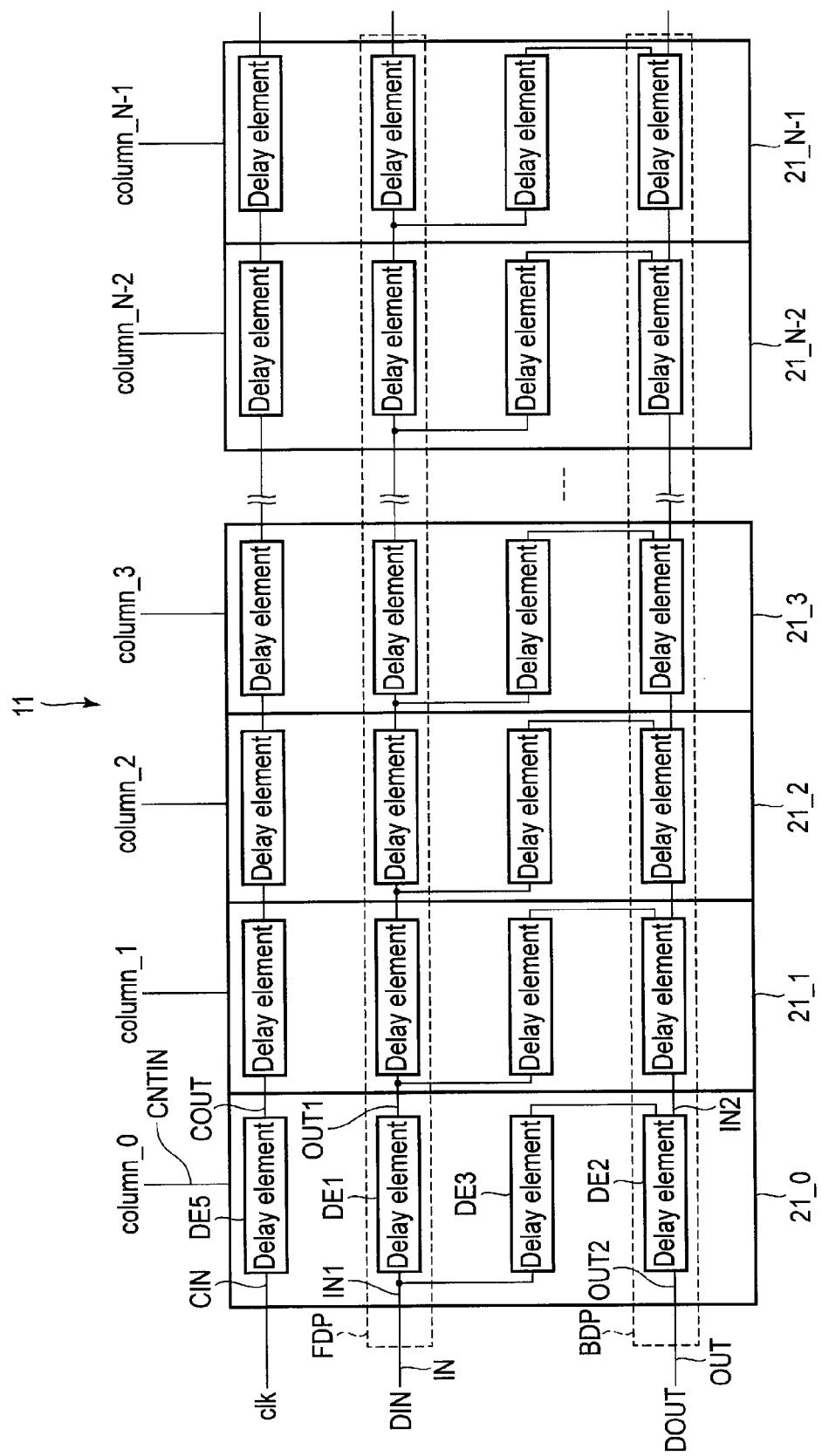
FIG. 5 illustrates an example of a delay section of the first embodiment.

FIG. 5 illustrates the delay section 11. The delay section 11 includes N units 21_0 to 21_N−1. When a reference number herein includes a set of a first component of an alphanumeric character, and a following underscore and a second component of an alphanumeric character, the second component distinguishes the first components of the same kind from each other. When several first components do not need to be distinguished, the description without a second component is used and it refers to all reference numbers with only a first component.

Each unit 21 has the same components and connections. Each unit 21 has a first input node IN1, a first output node OUT1, a second input node IN2, a second output node OUT2, a clock input node CIN, a clock output node COUT, and a control input node CNTIN. Each unit 21 includes a delay element DE1 between the first input node IN1 and the first output node OUT1, and outputs a signal received on its first input node IN1 from its first output node OUT1 after a lapse of a first period. Each unit 21 further includes a delay element DE2 between the second input node IN2 and the second output node OUT2, and outputs a signal received on its second input node IN2 from its second output node OUT2 after a lapse of a second period.

Each unit 21 still further includes a delay element DE5 between the clock input node CIN and the clock output node COUT, and outputs an external clock clk received on its clock input node CIN from its clock output node COUT after a lapse of a fourth period. The external clock clk is supplied from outside the semiconductor device 5.

The units 21_0 to 21_N−1 are connected in series. Specifically, for each of cases of i (i being a natural number greater than or equal to zero and less than or equal to N−2) being one to N−1, a unit 21_i is connected at its first output node OUT1 and the second input node IN2 to the first input node IN1 and the second output node OUT2 of a unit 21_i+1. As a result, the first input node IN1 of a unit 21_0 is connected to the first output node OUT1 of a unit 21_N−1 through the respective delay elements DE1 of the units 21_1 to 21_N−2. The structure of the series of the respective delay elements DE1 of the units 21_0 to 21_N−1 makes a forward delay path FDP.

The second output node OUT2 of the unit 21_0 is connected to the second input node IN2 of the unit 21_N−1 through the respective delay elements DE2 of the units 21_1 to 21_N−2. The structure of the series of the respective delay elements DE2 of the units 21_0 to 21_N−1 makes a backward delay path BDP.

Each unit 21 further includes a delay element DE3 between the forward delay path FDP and the backward delay path BDP. The delay element DE3 may be connected to any node in the unit 21 which includes that delay element DE3 as long as it is connected between the forward delay path FDP and the backward delay path BDP. FIG. 5 illustrates an example where each delay element DE3 is connected between the first input node IN1 and the input node of the second delay element sound DE2 in each unit. According to this example, each delay element DE3 outputs a signal received at its first input node IN1 after a lapse of a third period. In another example, the delay element DE3 is connected between the first input node IN1 and the second output node OUT.

The unit 21_0 receives a to-be-delayed signal on its first input node IN1. The to-be-delayed signal is the signal DIN received at the delay circuit 1, and is, for example, a clock. Therefore, the first input node IN1 of the unit 21_0 serves as the input node IN of the delay section 11. The unit 21_0 also outputs a signal received on its first input node IN1 after a lapse of a particular time on its second output node OUT2. Therefore, the second output node OUT2 of the unit 21_0 serves as the output node OUT of the delay section 11.

The units 21_0 to 21_N−1 receive column select signals column_0 to column_N−1, respectively. The column select signals column_0 to column_N−1 are supplied by the DLL 12. High-level column select signals column_0 to column_N−1 select the units 21_0 to 21_N−1, respectively. With the controller 123 of FIG. 4, one of the column select signals column_0 to column_N−1 is made high.

As a result, one of the units 210 to 21_N−1 which received the high-level column select signal column is selected. In an unselected unit 21, the first input node IN1 and the second output node OUT2 of that unit 21 are electrically disconnected. With such connections, each unselected unit 21 outputs a signal received on its first input node IN1 from its first output node OUT1 after the lapse of the first period, and outputs a signal received on its second input node IN2 from its second output node OUT2 after the lapse of the second period.

In contrast, in the selected unit 21, the forward delay path FDP and the backward delay path BDP are electrically connected through the delay element DE3. As a result, the selected unit 21 outputs the signal received on its first input node IN1 from its second output node OUT2 after the lapse of a delay time by a delay element through which this signal travels. The electric connection by the selected unit 21 forms a signal path between the first input node IN1 and second output node OUT2 of the unit 21_0. This signal path corresponds to the whole delay path of the delay section 11. In other words, the delay path for a case of unit 21_i selected includes (or, consists of) a section of the forward delay path FDP from the input node IN to the input node of the delay element DE3 of the unit 21_i, the third delay element DE3 of the unit 21_i, and a section of the backward delay paths BDP from the output node of the third delay element DE3 of the unit 21_i to the output node OUT. Therefore, the full length of the delay path varies in accordance with the unit 21 selected. The change of the delay path through selection of a unit 21 is conceptually illustrated in FIG. 6. The solid line represents the delay path DP.

The longest delay path DP, i.e., the delay section 11 of the maximum configuration, is implemented through selection of the unit 21_N−1. Therefore, the possible maximum configuration by a particular delay section 11 depends on the number of the units 21. FIG. 7 illustrates another example of the delay section 11. The delay section 11 of FIG. 7 includes M delay sections 21 (21_0 to 21_M−1). M is a natural number of less than N. Supposing the delay section 11 in FIG. 6 has the 360° phase capability, then the delay section 11 of FIG. 7 has a smaller amount of delay (for example, 180° phase) as the maximum capability.

An example of a specific circuit for the delay section 11 will now be described. FIG. 8 illustrates an example of a specific circuit of the delay section 11. Each unit 21 includes buffers B1 and B2, a D flip-flop F1, an AND gate A1, and an OR gate O1 as illustrated in FIG. 8. The buffer B1 is connected at its input and output nodes to the clock input node CIN and the clock output node COUT, respectively. The buffer B2 is connected at its input and output nodes to the first input node IN1 and the first output node OUT1, respectively. The buffer B2 corresponds to the delay element DE1.

The clock input node CIN is also connected to the clock input node of the flip-flop F1. The flip-flop F1 also receives a corresponding column select signal on its data input node. The flip-flop F1 is connected at its output node to an input node of the AND gate A1. The AND gate A1 is connected at another input node to the first input node IN1, and at its output node to an input node of the OR gate O1. The OR gate O1 is connected at another input node to the second input node IN2, and at its output node to the second output node OUT2. The OR gate O1 corresponds to the delay element DE2. The AND gate A1 corresponds to the delay element DE3 for a case which is based on the FIG. 5 example. The second input node OUT2 of the unit 21_N−1 is grounded.

The delay section 11 further includes an AND gate A2, a selector S1, and an inverter I1. The inverter I1 is connected at its input and output nodes to the first input node IN1 of the unit 21_0 and an input node of the selector S1, respectively. The selector S1 further receives the external clock clk and a mode select signal async. The mode select signal async is supplied from outside the DLL 12 or the semiconductor device 5. The selector S1 outputs the external clock clk or the output of the inverter I1 in accordance with the mode select signal async. The delay circuit 1 can operate in either a synchronous mode or an asynchronous mode. The synchronous mode is a mode in which the delay circuit 1 operates in accordance with the external clock clk, and the asynchronous mode is a mode in which the delay circuit 1 operates without the external clock clk. The synchronous mode or the asynchronous mode is selected by the mode select signal async. In the synchronous mode and the asynchronous mode, the selector S1 outputs the external clock clk and the output of the inverter I, respectively. In the asynchronous mode, the delay circuit 1 receives the clock in the signal DIN as the to-be-delayed signal, and uses this clock also as a clock for operation of the delay circuit 1.

The output node of the selector S1 is connected to the input node of AND gate A2. The AND gate A2 further receives a signal load from the DLL 12, and is connected at its output node to the clock input node CIN of the unit 21_0. The signal load is made high in order to update the column select signals column.

Thus, the delay circuit 1 of the first embodiment includes identical units 21 connected in series, and the forward delay path FDP which begins at the input node IN and the backward delay path BDP reaching the output node OUT are electrically connected by a selected unit 21 to make the delay path DP of the delay section 11. For this reason, the delay sections 11 with different maximum delay capabilities (or, configurations) are all the same in respect of having the repeatedly-provided units 21 and differ only in the number of the units 21 connected in series. Therefore, the delay sections 11 of smaller configurations do not need to have components that would be necessary to have the same load on the first input node IN1 as the load on the first input node IN1 of the delay section 11 of the maximum configuration but unnecessary for its operation. This enables high-speed operation and a small area of the delay section 11 of a non-maximum configuration. Advantages of the delay section 11 of non-maximum configuration having no unnecessary components, among others, are significant. This is because many logical gates are not connected to the input node IN of the delay section 11, unlike the examples of FIGS. 1 to 3. Specifically, whereas the input node of the delay section of the maximum configuration has a heavy load and such load is added also to the input node of the delay section of a non-maximum configuration in the example of FIGS. 1 to 3, the delay section 11 does not suffer such inconvenience. Therefore, the delay section 11, especially of a non-maximum configuration, can operate faster than examples of FIGS. 1 to 3.

Moreover, the delay sections 11 of different configurations differ only in the lengths of the forward delay path FDP and the backward delay path BDP, and therefore have a uniform load on their input nodes IN1. This simplifies estimation of a delay performance of each of delay sections 11 of different configurations and adjustment of operation timings among delay sections 11 of different configurations.

Moreover, the delay sections 11 of different configurations being different only in the lengths of the forward delay path FDP and the backward delay path BDP lead to the same positions of the input nodes IN and the output nodes OUT of the delay sections 11, without dependency on the configurations of the delay sections 11. This improves the convenience of the delay circuit 1. Specifically, a circuit connected to the delay circuits 1 is not affected by the influence caused by the difference in the positions of the input node and the output node of the delay circuit 1 in accordance with the configurations.

Second Embodiment

The second embodiment is based on the first embodiment and differs from the first embodiment in a clock for operation of the units of the delay section.

The delay circuit 1 of the second embodiment includes the same delay section 11 as that in FIG. 5 as components for delaying a signal. In contrast, in the second embodiment, the delay section 11 includes additional components. Therefore, the delay section of the second embodiment is hereinafter referred to as a delay section 11b for distinction.

The delay section 11b of the second embodiment includes N units 21b_0 to 21b_N−1. The units 21b_0 to 21b_N−1 all have the same components and connections. The units 21b include the components and connections of the units 21 illustrated in FIG. 5. Therefore, the components and connections of each unit 21b for generating the output signal DOUT from the input signal DIN are the same as those of FIG. 5. In contrast, each unit 21b is configured to use the signal on its own first input node IN1 as a clock for its own operation. Specifically, each unit 21b can operate at a timing in accordance with a selected one of the external clock clk and the signal on its own first input node IN1.

Figure 9:
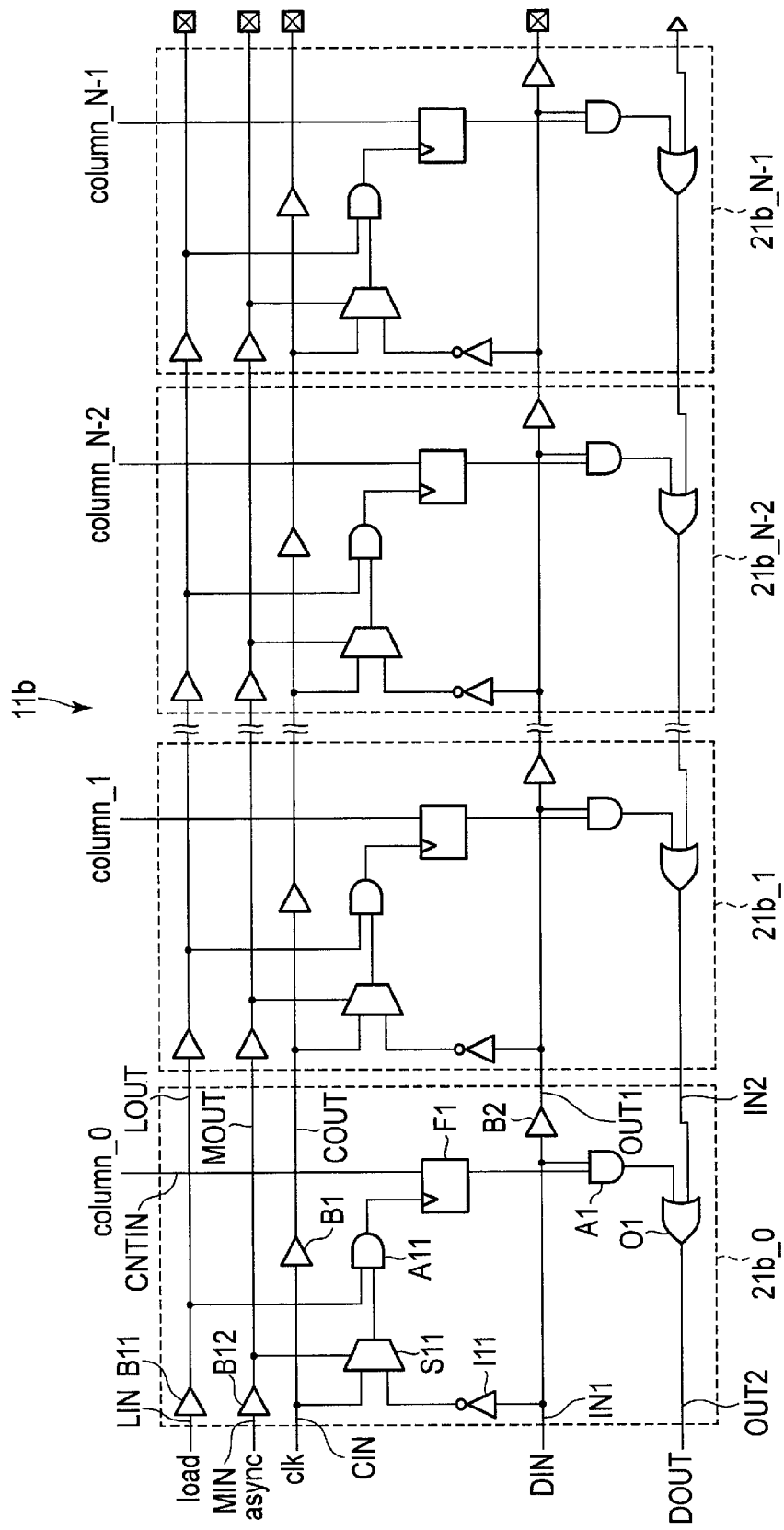
FIG. 9 illustrates an example of a specific circuit of a delay section of a second embodiment.

An example of a specific circuit of the delay section 11b will now be described. FIG. 9 illustrates an example of a specific circuit of the delay section 11b of the second embodiment. The specific circuit is also based on that of the first embodiment. As in the unit 21 of the first embodiment, each unit 21b includes a first input node IN1, a first output node OUT1, a second input node IN2, a second output node OUT2, a buffer B2, an AND gate A1, an OR gate O1, and a flip-flop F1. They are connected as in the unit 21. Moreover, the units 21b_0 to 21b_N−1 receive the column select signals column_0 to column_N−1 as in the delay section 11 of the first embodiment, respectively. Furthermore, the units 21b_0 to 21b_N−1 are connected in series in the same manner as the units 21b_0 to 21b_N−1. As in the first embodiment, one of the column select signals column_0 to column_N−1 is made high, and thereby one of the units 21b_0 to 21b_N−1 is selected. With the components and connections thus described, the delay section 11b can implement a delay of a selected amount through a selection of one unit 21b as in the first embodiment.

In contrast, each unit 21b receives a signal different from that in the first embodiment on the clock input node of the flip-flop F1. The details are as follows. Each unit 21b further includes an inverter I11, a selector S11, an AND gate A11, buffers B11 and B12, control input nodes LIN and MIN, and control output nodes LOUT and MOUT. A unit 21b_i is connected at its control output nodes LOUT and MOUT to the control input nodes LIN and MIN of a unit 21b_i+1, respectively. A unit 21b_0 receives the external clock clk from outside the semiconductor device 5 and signals load and async on its clock input node CIN and its control input nodes LIN and MIN, respectively.

The control input node LIN is connected to the input node of the buffer B11, whose output node is the control output node LOUT. The control input node MIN is connected to the input node of the buffer B12, whose output node is the control output node MOUT.

The first input node IN1 is connected to the input node of the inverter I11, whose output node is connected to an input node of the selector S11. Another input node of the selector S11 is connected to the clock input node CIN. The selector S11 receives the signal on the output node of the buffer 12, and, in accordance with the received signal, outputs the output of the inverter I11 or the signal on the clock input CIN. While the delay circuit 1 operates in the asynchronous mode, the selector S11 outputs the output of the inverter I11. The output of the selector S11 is supplied to the AND gate A11. The AND gate A11 further receives the output of the buffer B11. The AND gate A11 supplies the output to the clock input of the flip-flop F1.

Thus, the delay circuit of the second embodiment includes identical units 21b connected in series, and the forward delay path FDP which begins at the input node IN and the backward delay path BDP reaching the output node OUT are electrically connected by one selected unit 21b to make the delay path DP of the delay section 11, as in the first embodiment. Therefore, the same advantages as those of the first embodiment can be obtained by the second embodiment.

Moreover, each unit 21b operates at a timing in accordance with the signal on its own first input node IN1 in the asynchronous mode. This can produce the following advantages. The outputting by the flip-flops F1 in accordance with change of the values of column select signals column_0 to column_N−1 in order to adjust a delay amount by the delay section 11b must be completed while the first input nodes IN1 of all the units 21b are low. Under such restrictions, in the units 21b, the outputs of the flip-flops F1 are based on the timing of the signal on their own first input nodes IN1. For this reason, the outputting from the flip-flops F1, i.e., the outputting of the column select signals column_0 to column_N−1 starts after a very short period from the transition to the low level of the signal on the first input nodes IN1. This ensures that the output of the flip-flop F1 (i.e., column select signal column) enter the AND gate A1 while the signal on the input node IN1 is low in any unit 21b. Specifically, the delay amount can be changed with a high accuracy also with a clock (i.e., the input signal DIN) of a high frequency in the asynchronous mode.

Third Embodiment

The third embodiment is based on the second embodiment and includes a modification to the second embodiment in order to intercept transfer of the to-be-delayed signal.

The delay circuit 1 of the third embodiment includes the same delay section 11 as that in FIG. 5 as the components for delaying a signal. In the third embodiment, however, the delay section 11 differs from the first embodiment as regards the delay elements DE1 to DE3, and includes additional components. Therefore, the delay section of the third embodiment is hereinafter referred to as a delay section 11c for distinction.

The delay section 11c of the third embodiment includes N units 21c_0 to 21c_N−1. The units 21c_0 to 21c_N−1 all have the same components and connections. The units 21c include the components and connections of the units 21 illustrated in FIG. 5, and have additional components and connections. Therefore, the components and connections of the units 21c for generating the output signal DOUT from the input signal DIN are the same as those of FIG. 5. In addition, each unit 21c is configured to use the signal on its own first input node IN1 as a clock for its own operation, as in the second embodiment. Specifically, each unit 21c can operate at a timing in accordance with a selected one of the external clock clk and the signal on its first input node IN1. Furthermore, when selected, each unit 21c does not output a signal from its first output node OUT1. Specifically, the first input node IN1 and the first output node OUT of one selected unit 21c are electrically disconnected.

An example of a specific circuit of the delay section 11c will now be described. FIG. 10 illustrates an example of a specific circuit of the delay section 11c of the third embodiment. As in unit 21 of the first embodiment, each unit 21c includes a first input node IN1, a first output node OUT1, a second input node IN2, a second output node OUT2, an AND gate A1, and an OR gate O1. They are connected as in unit 21. The AND gate A1 receives similar signals as those in the unit 21, although they are supplied from another source.

Moreover, the units 21c_0 to 21c_N−1 receive column select signals column_0 to column_N−1, respectively, as in the delay section 11 of the first or the second embodiment.

Furthermore, the units 21c_0 to 21c N−1 are connected in series in the same manner as the units 21_0 to 21_N−1. As in the first embodiment, one of the units 21c_0 to 21c N−1 is selected. However, in each unit 21c, the buffer B2 of that unit 21 is replaced with the AND gate A21. The input node and output node of the AND gate A21 are connected to the same components as those to which the input node and output node of the buffer B2 are connected. The AND gate A1 corresponds to the delay element DE1. Moreover, in the unit 21c, the flip-flop F1 of the unit 21 is replaced with a flip-flop F21. The flip-flop F21 corresponds to the flip-flop F1, i.e., each flip-flop F21 of the units 21c_0 to 21c_N−1 receives column select signals column_0 to column_N−1 on the data input node, respectively.

Each unit 21c also includes the inverter I11, the selector S11, and the AND gate A11, as does the unit 21b. Moreover, these components are connected as in the second embodiment, and are connected to the same components as those in the second embodiment. As will be described, although the output of the flip-flop F21 is connected to a component different from that to which the flip-flop F1 in the second embodiment is connected, a signal based on the output of the flip-flop F21 is supplied to the AND gate A1. Therefore, each unit 21c can operate in accordance with the signal on its first input node IN1 in the asynchronous mode, as can the unit 21b.

In contrast, however, each unit 21c further includes an AND gate A21 and an OR gate O21. The output of the flip-flop F21 is supplied to the OR gate O21, and serves as a control output node GOUT. The OR gate O21 is connected at another node to the control output node LOUT, and at the output node to another input node of the AND gate A21. The flip-flop F21 supplies an inverted version of the signal on its output node to the AND gate A22. Another input node of the AND gate A22 serves as a control input node GIN. The output of the AND gate A22 is received on the input node of the AND gate A1 which receives the output of the flip-flop F1 in the first and second embodiments.

The control output node GOUT of a unit 21c_i is connected to the control input node GIN of a unit 21c_i+1. The control input node GIN of a unit 21c_0 is connected to a power supply node.

In order to form the delay path DP between the first input node IN1 and the second output node OUT2 of the unit 21c_i, i.e., in order to select the unit 21c_i, the control signals column_0 to column_i−1 are made high. As a result, the delay path DP is formed between the input node DIN and the output node DOUT through the unit 21c_i. This delay path DP includes the set of the AND gates A21 of each of the units 21c_0 to 21c_i−1, the AND gate A1 of the unit 21c_i, and the set of the OR gates O1 of each of the units 21c_0 to 21c_i. FIG. 10 illustrates a delay path DP for a case of i being 1. Thus, the delay section 11c can implement a delay of a selected amount through a selection of one unit 21c as in the first embodiment. In contrast, in the unit 21c_i, its first input node IN1 and first output node OUT1 are electrically disconnected.

Thus, the delay circuit of the third embodiment includes identical units 21 connected in series, and the forward delay path FDP which begins at the input node IN and the backward delay path BDP reaching the output node OUT are electrically connected by a selected unit 21 to make the delay path DP of the delay section 11, as in the first embodiment. Moreover, each unit 21c operates at a timing in accordance with the signal on its own first input node IN1 in the asynchronous mode, as in the second embodiment. For these reasons, according to the third embodiment, the same advantages as those in the first and the second embodiments can be obtained.

Furthermore, each unit 21c electrically disconnects the first input node IN1 and the first output nodes OUT when selected. Therefore, the signal DIN does not travel from the selected unit 21c_i to the unit 21c_i+1. This prevents consumption of current in unselected units 21c_i+1 to 21c_N-1, and suppresses the power consumption of the delay circuit 1.

Fourth Embodiment

The fourth embodiment is based on the first to third embodiments and has the same features as the first, second, or third embodiment, but differs from the first to third embodiments in the logics of signals which have passed the delay elements of each unit.

The logical gate which consists of the fewest components outputs a signal with an inverted logic of the input signal, i.e., negative logic, as known for a person skilled in the art. Therefore, the AND gate, the OR gate, and the buffer, which output signals with the same logic as the input signals, i.e., positive logic, are implemented by the combination of two logical gates which output negative logics in actuality. For example, an AND gate is a serially-connected NAND gate and inverter. Therefore, the AND gate transmits a signal to its output node from its input node with the same delay amount as the sum of the delay amounts of the NAND gate and the inverter. Similarly, an OR gate is a serially-connected NOR gate and inverter, and a buffer is made of two serially-connected inverters. Therefore, each of the OR gate and the buffer also transmits a signal to its output node from its input node with the same delay amount as the sum of the delay amounts of the two logical gates each having the fewest components.

Such restrictions reduce the resolution in adjustment of the delay amount of a delay circuit which has logical gates which operate with positive logics in a delay path. In contrast, if logical gates in a delay path are of the negative logic type, the amount of the delay of the signal by a delay circuit can be controlled more finely. In the fourth embodiment, the first and second output nodes OUT1 and OUT2 output signals of opposite logics of signals on the first and second input nodes IN1 and IN2, (or, inverted signals or negative logic signals), respectively.

The delay circuit 1 of the fourth embodiment includes the same delay section 11 as that in FIG. 5 as components for delaying a signal. In contrast, in the fourth embodiment, the delay section 11 differs from the first embodiment as regards the delay elements DE1 to DE3, and includes additional components. Therefore, the delay section of the fourth embodiment is hereinafter referred to as a delay section 11d for distinction.

The delay section 11d of the fourth embodiment includes N units 21d_0 to 21d_N-1. The units 21d_0 to 21d_N-1 all have the same components and connections. Each unit 21d includes the delay elements DE1 to DE3 included in the unit 21 illustrated in FIG. 5 and connected as in the FIG. 5, and includes additional components. Therefore, the components and connections of each unit 21d for generating the output signal DOUT from the input signal DIN are the same as those of FIG. 5.

In contrast, the delay element DE1 outputs on its output node the inverted signal of the signal on its input node. To this end, each unit 21d has, as its delay element DE1, a logical gate which outputs on its output node the inverted signal of a signal on its input node. The delay element DE2 also outputs on its output node the inverted signal of a signal on its input node. To this end, each unit 21d has, as its delay element DE2, a logical gate which outputs on its output node the inverted signal of a signal on its input node. When selected, each unit 21d outputs on its output node the signal of the same logic as a signal, i.e., the non-inverted signal or a positive logic signal, received on its input node. To this end, each unit 21d has a logical gate which outputs on its output node the non-inverted signal of a signal on its input node while it is receiving the control signal.

An example of a specific circuit of the delay section 11d will now be described. FIG. 11 illustrates an example of a specific circuit of the delay section of the fourth embodiment. In this example, two units 21d for two respective adjacent columns make a set 41, and such sets 41 are provided repeatedly. Therefore, the delay section 11d includes N/2 sets 41_0 to 41_(N/2-1). The units 21d_0, 21d_2, 21d_4, ... 21d_N-2 for the columns of even-numbered addresses differ from the units 21d_1, 21d_3, 21d_5, ... 21d_N-1 for the columns of odd-numbered addresses in respect of the delay elements DE1, DE2, and DE3. Furthermore, the units 21d for even-numbered columns differ from the units 21d for odd-numbered columns in the components for controlling the delay elements DE2 and DE3.

Each of the units 21d for even-numbered columns includes NAND gates NA41 to NA43 as the delay elements DE1 to DE3, respectively. A first input node of each of the NAND gates NA41 and NA43 is connected to the first input node IN1. As will be described, a second input node of each of the NAND gates NA41 and NA43 receives a signal for controlling enabling and disabling of outputting of a signal of each first input node to each output node. The output node of the NAND gate NA41 serves as the first output node OUT1. Two input nodes of the NAND gate NA42 are connected to the second input node IN2 and the output node of the NAND gate NA43, respectively. The output node of the NAND gate NA42 serves as the second output node OUT2.

Each of the units 21d for odd-numbered columns includes NOR gates NO41 to NO43 as the delay elements DE1 to DE3, respectively. A first input node of each of the NOR gates NO41 and NO43 is connected to the first input node IN1. As will be described, a second input node of each of the NOR gates NO41 and NO43 receives a signal for controlling enabling and disabling of outputting of a signal of each first input node to each output node. The output node of the NOR gate NO41 serves as the first output node OUT1. Two input nodes of the NOR gate NO42 are connected to the second input node IN2 and the output node of the NOR gate NO43, respectively. The output node of the NOR gate NO42 serves as the second output node OUT2.

Each unit 21d further includes components for generating signals for controlling its delay elements DE1 to DE3. Specifically, each of the units 21d for even-numbered columns includes a selector S41, a NAND gate NA45, a flip-flop F41, a NOR gate NO45, an OR gate O41, a buffer B41, inverters I43 and I46, control input nodes LIN and MIN, and control output nodes LOUT and MOUT.

The clock input node CIN is connected to the input node of the inverter I43, whose output node is the clock output node COUT. The control input node LIN is connected to the input node of the inverter I46, whose output node is the control output node LOUT. The control input node MIN is connected to the input node of the buffer B41, whose output node is the control output node MOUT.

The selector S41 is connected at the input node A1 to the first input node IN1, and connected at the input node A0 to the output node of the inverter I43. The selector S41 receives the output signal of the buffer B41, and outputs the signal on the node A0 or A1 in accordance with the output signal of the buffer B41. The output of the selector S41 is supplied to the NAND gate NA45. The NAND gate NA45 also receives the output signal on the control input node LIN.

The output of the NAND gate NA45 is supplied to the clock input node of the flip-flop F41. The flip-flop F41 receives a corresponding column select signal on its data input. Specifically, the flip-flop F41 of a unit 21d_i receives a column select signal column_i on its data input. The output node of the flip-flop F41 is connected to the input node of the NOR gate NO45 and serves as a control output node FOUT. Another input node of the NOR gate NO45 is connected to a control input node FIN. The output of the NOR gate NO45 is supplied to the second input node of the NAND gate NA43.

The output of the flip-flop F41 is also supplied to the OR gate O41. Another input node of the OR gate O41 receives a signal load_p. The output of the OR gate O41 is supplied to a second input node of the NAND gate NA41.

In contrast, each of the units 21d for odd-numbered columns includes a selector S42, a NAND gate NA47, a flip-flop F42, NOR gates NO46 and NO47, inverters I41 and I44, a buffer B42, control input nodes LIN and MIN, and control output nodes LOUT and MOUT.

The clock input node CIN is connected to the input node of the inverter I44, whose output node is the clock output node COUT. The control input node LIN is connected to the input node of the inverter I45, whose output node is the control output node LOUT. The control input node MIN is connected to the input node of the buffer B42, whose output node is the control output node MOUT.

The selector S42 is connected at the input node A1 to the first input node IN1, and connected at the input node A0 to the output node of the inverter I44. The selector S42 receives the output signal of the buffer B42, and outputs the signal on the node A0 or A1 in accordance with the output signal of the buffer B42. The output of the selector S42 is supplied to the NOR gate NO46. The NOR gate NO46 also receives the output signal on the control input node LIN.

The output of the NOR gate NO46 is supplied to the clock input node of the flip-flop F42. The flip-flop F42 receives a corresponding column select signal on its data input. Specifically, the flip-flop F42 of a unit 21d_i receives a column select signal column_i on its data input. The output of the flip-flop F42 is supplied to the NAND gate NA47 through the inverter I41. The output node of the inverter I41 serves as a control input node FOUT. Another input node of the NAND gate NA47 is connected to a control input node FIN. The output of the NAND gate NA47 is supplied to the second input node of the NOR gate NO43.

The output of the flip-flop F42 is also supplied to the NOR gate NO47. Another input node of the NOR gate NO47 receives the signal load_p. The output of the NOR gate NO47 is supplied to a second input node of the NOR gate NO41.

The clock output node COUT and the control output nodes LOUT, MOUT, and FOUT of a unit 21d i are connected to the clock input node CIN and the control input nodes LIN, MIN, and FIN of the a 21d_i+1. The unit 21d_0 receives, at its clock input node CIN and control input nodes LIN, MIN, and FIN, the external clock clk and the signals load, async, and FIN from outside the semiconductor device 5, respectively.

As in the first embodiment, one of the column select signals column_0 to column_N−1 is made high, and thereby one of the units 21d_0 to 21d_N−1 is selected.

Each unit 21d has such components and connections. As a result, each unit 21d operates at a timing in accordance with the signal on its own first input node IN1 in the asynchronous mode as in the second embodiment, and electrically disconnects its first input node IN1 and first output nodes OUT1 when selected, as in the third embodiment. Moreover, each unit 21d includes only one logical gate of the minimum configuration between the first input node IN1 and the first output node OUT1, and includes only one logical gate of the minimum configuration between the second input node IN2 and the second output node OUT2. For this reason, a delay which the signal traveling through the forward delay path FDP experiences in one unit 21d is a delay by one logical gate of the minimum configuration. Similarly, a delay which the signal traveling through the backward delay path BDP experiences in one unit 21d is a delay by one logical gate of the minimum configuration. Needless to say, the signal DIN and the signal DOU have the same logic.

Thus, the delay circuit of the fourth embodiment includes identical units 21 connected in series, and the forward delay path FDP which begins at the input node IN and the backward delay path BDP reaching the output node OUT are electrically connected by one selected unit 21d to make the delay path DP of the delay section 11, as in the first embodiment. Therefore, according to the fourth embodiment, the same advantages as those in the first embodiment can be obtained. Moreover, according to the fourth embodiment, the same advantages as those in the second and third embodiments can be obtained.

Furthermore, each unit 21d includes only one logical gate of the minimum configuration as each of the delay elements DE1 and DE2. For this reason, the delay section 11 can implement a delay which can be controlled by a resolution higher than that in an example including logical gates of positive logic as the delay elements DE1 and DE2.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A delay circuit comprising:
   units each of which comprises:
   a first delay element which has a first input node and a first output node,
   a second delay element which has a second input node and a second output node, and
   a third delay element between the first delay element and the second delay element, wherein
   the first output node of the first delay element of a first unit of the units is connected to the first input node of the first delay element of a second unit of the units,
   the second input node of the second delay element of the first unit is connected to the second output node of the second delay element of the second unit, and
   a signal on the first input node of the first delay element of the first unit is output from the second output node of the second delay element of the first unit through the third delay element of the second unit.

2. The circuit of claim 1, wherein
   the first delay element of each of the first and second units is serially connected to make a first delay path,
   the second delay element of each of the first and second units is serially connected to make a second delay path, and while the second unit is receiving a control signal, the first delay path and the second delay path are electrically connected through the third delay element of the second unit.

3. The circuit of claim 2, wherein
in the first unit, the first delay path and the second delay path are electrically disconnected.

4. The circuit of claim 2, wherein
each of the first and second units further has a flip-flop which has a third input node, and
the control signal is supplied to the third delay element of the second unit based on a signal on the third input node of the flip-flop of the second unit, to electrically connect the first delay path to the second delay path through the third delay element of the second unit.

5. The circuit of claim 4, wherein
the third input node of the flip-flop of the first unit receives a signal based on a clock or a signal based on the first input node of the first delay element of the first unit, and
the third input node of the flip-flop of the second unit receives a signal based on the clock or a signal based on the first input node of the first delay element of the second unit.

6. The circuit of claim 2, wherein
in each of the first and second units,
the first delay element comprises a buffer,
the second delay element comprises an OR gate, and
the third delay element comprises an AND gate.

7. The circuit of claim 1, wherein
while the first unit is receiving a first control signal and the second unit is receiving a second control signal, the third delay element of the second unit electrically connects the first delay path and the second delay path and the first input node of the first delay element of the second unit and the first output node of the first delay element of the second unit are electrically disconnected.

8. The circuit of claim 7, wherein
in each of the first and second unit,
the first delay element comprises an AND gate,
the second delay element comprises an OR gate, and
the third delay element comprises an AND gate.

9. The circuit of claim 1, wherein
the first unit:
outputs a signal of an opposite logic of a signal on the first input node of the first delay element of the first unit on the first output node of the first delay element of the first unit,
outputs a signal of an opposite logic of a signal on the second input node of the second delay element of the first unit on the second output node of the second delay element of the first unit, and
outputs a signal of the same logic of a signal on the first input node of the first delay element of the first unit on the second output node of the second delay element of the first unit while the first unit is receiving a first control signal, and
the second unit:
outputs a signal of an opposite logic of a signal on the first input node of the first delay element of the second unit on the first output node of the first delay element of the second unit,
outputs a signal of an opposite logic of a signal on the second input node of the second delay element of the second unit on the second output node of the second delay element of the second unit, and
outputs a signal of the same logic of a signal on the first input node of the first delay element of the second unit on the second output node of the second delay element of the second unit while the second unit is receiving a second control signal.

10. The circuit of claim 9, wherein
each of the first to third delay elements of one of the first and second units comprises a NAND gate, and
each of the first to third delay elements of the other one of the first and second units comprises a NOR gate.

11. A delay circuit comprising:
a first to $n^{th}$ (n being a natural number of two or more) units, each of which comprises:
a first delay element which has a first input node and a first output node,
a second delay element which has a second input node and a second output node, and
a third delay element between the first delay element and the second delay element, wherein
for each of cases of i (i being a natural number greater than or equal to two and less than or equal to n) being two to n, the first output node of the first delay element of the $i-1^{th}$ unit is connected to the first input node of the first delay element of the $i^{th}$ unit, and the second input node of the second delay element of the $i-1^{th}$ unit is connected to the second output node of the second delay element of the $i^{th}$ unit, and
a signal on the first input node of the first delay element of the first unit is output from the second output node of the second delay element of the first unit through the third delay element of one unit of the second to $n^{th}$ units.

12. The circuit of claim 11, wherein
the first delay element of each of the first to $n^{th}$ units is serially connected to make a first delay path,
the second delay element of each of the first to $n^{th}$ units is serially connected to make a second delay path, and
while the one unit is receiving a control signal, the first delay path and the second delay path are electrically connected through the third delay element of the one unit.

13. The circuit of claim 12, wherein
in units of the first to $n^{th}$ units other than the one unit, the first delay path and the second delay path are electrically disconnected.

14. The circuit of claim 12, wherein
each of the first to $n^{th}$ units further has a flip-flop which has a third input node, and
the control signal is supplied to the third delay element of the one unit based on a signal on the third input node of the flip-flop of the one unit, to electrically connect the first delay path to the second delay path through the third delay element of the one unit.

15. The circuit of claim 14, wherein
the third input node of the flip-flop of the first unit receives a signal based on a clock or a signal based on the first input node of the first delay element of the first unit, and
for each of cases of i being 2 to n, the third input node of the flip-flop of the $i^{th}$ unit receives a signal based on the clock or a signal based on the first input node of the first delay element of the $i^{th}$ unit.

16. The circuit of claim 12, wherein
in each of the first to $n^{th}$ units,
the first delay element comprises a buffer,
the second delay element comprises an OR gate, and
the third delay element comprises an AND gate.

17. The circuit of claim 11, wherein
for each of cases of k (k being a natural number greater than or equal to one and less than or equal to n) being one to n, while the $k^{th}$ unit is receiving a $k^{th}$ control signal, the third delay element of the k+1$^{th}$ unit electrically connects the first delay path and the second delay path and the first input node of the first delay element of the k$^{th}$ unit and the first output node of the first delay element of the k$^{th}$ unit are electrically disconnected.

18. The circuit of claim 17, wherein
in each of the first to n$^{th}$ units,
the first delay element comprises an AND gate,
the second delay element comprises an OR gate, and
the third delay element comprises an AND gate.

19. The circuit of claim 11, wherein
for each of cases of k (k being k being a natural number greater than or equal to one and less than or equal to n) being 1 to n, the k$^{th}$ unit:
outputs a signal of an opposite logic of a signal on the first input node of the first delay element of the k$^{th}$ unit on the first output node of the first delay element of the k$^{th}$ unit,
outputs a signal of an opposite logic of a signal on the second input node of the second delay element of the k$^{th}$ unit on the second output node of the second delay element of the k$^{th}$ unit, and
outputs a signal of the same logic of a signal on the first input node of the first delay element of the k$^{th}$ unit on the second output node of the second delay element of the k$^{th}$ unit while the k$^{th}$ unit is receiving a k$^{th}$ control signal.

20. The circuit of claim 19, wherein
in the j$^{th}$ (j being k being a natural number greater than or equal to two and less than or equal to n) unit, each of the first to third delay elements comprises a NAND gate, and
in the j−1$^{th}$ unit, each of the first to third delay elements comprises a NOR gate.

\* \* \* \* \*